United States Patent
Matsumiya

(10) Patent No.: US 10,904,459 B2
(45) Date of Patent: Jan. 26, 2021

(54) ARRAY SENSOR INCLUDING RESISTOR NETWORK WITH BIAS VOLTAGE SUPPLY NODES AND IMAGING APPARATUS INCLUDING ARRAY SENSOR

(71) Applicant: FUJITSU LIMITED, Kawasaki (JP)

(72) Inventor: Yasuo Matsumiya, Hadano (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/040,700

(22) Filed: Jul. 20, 2018

(65) Prior Publication Data
US 2019/0037153 A1    Jan. 31, 2019

(30) Foreign Application Priority Data
Jul. 26, 2017    (JP) ................................ 2017-144837

(51) Int. Cl.
| H04N 5/33 | (2006.01) |
| H04N 5/378 | (2011.01) |
| H01L 27/146 | (2006.01) |

(52) U.S. Cl.
CPC .............. *H04N 5/33* (2013.01); *H04N 5/378* (2013.01); *H01L 27/1465* (2013.01); *H01L 27/14652* (2013.01)

(58) Field of Classification Search
CPC ...... H04N 5/33; H04N 5/378; H01L 27/1465; H01L 27/14652
See application file for complete search history.

(56) References Cited

U.S. PATENT DOCUMENTS

| 8,884,240 B1* | 11/2014 | Shah ................... G01R 33/481 250/363.05 |
| 2003/0230733 A1* | 12/2003 | Tanaka ..................... G01J 5/24 250/553 |
| 2009/0121139 A1* | 5/2009 | Chamming's ....... H04N 5/3655 250/340 |
| 2009/0168046 A1* | 7/2009 | Barrows .............. H04N 5/3745 356/28 |
| 2016/0056785 A1* | 2/2016 | Wolfe ....................... G01J 1/18 250/340 |
| 2016/0057369 A1* | 2/2016 | Wolfe ..................... H04N 5/33 348/322 |
| 2016/0088243 A1* | 3/2016 | Higashi ............ H01L 27/14612 348/294 |
| 2016/0191833 A1 | 6/2016 | Higashi et al. |
| 2019/0368941 A1* | 12/2019 | Aziz ....................... H04N 5/33 |

FOREIGN PATENT DOCUMENTS

| JP | 10-304251 | 11/1998 |
| JP | 2001-086518 | 3/2001 |
| JP | 2009-295841 | 12/2009 |
| JP | 2010-056874 | 3/2010 |
| JP | 2015-056700 | 3/2015 |

\* cited by examiner

*Primary Examiner* — Jamie J Atala
*Assistant Examiner* — Michael Robert Cammarata
(74) *Attorney, Agent, or Firm* — Fujitsu Patent Center

(57) ABSTRACT

An array sensor includes a sensor element array that includes a plurality of sensor elements, a signal processing circuit array that includes a plurality of signal processing circuits coupled to the corresponding sensor elements, and a resistor network that supplies bias voltages to the corresponding signal processing circuits, wherein different voltages are applied to at least two voltage application nodes in the resistor network.

10 Claims, 15 Drawing Sheets

ARRAY SENSOR INCLUDING RESISTOR NETWORK WITH BIAS VOLTAGE SUPPLY NODES AND IMAGING APPARATUS INCLUDING ARRAY SENSOR

CROSS-REFERENCE TO RELATED APPLICATION

This application is based upon and claims the benefit of priority of the prior Japanese Patent Application No. 2017-144837, filed on Jul. 26, 2017, the entire contents of which are incorporated herein by reference.

FIELD

The embodiments discussed herein are related to an array sensor and an imaging apparatus.

BACKGROUND

For example, infrared image capturing apparatuses including an infrared array sensor that converts an incident infrared ray into an electrical signal to obtain an image signal have been put into practical use as imaging apparatuses including an array sensor (an imaging element and an imaging sensor). For example, a mercury cadmium telluride (HgCdTe) photodiode (MCT), a quantum well sensor (Quantum Well Infrared Photodetectors (QWIP)), and the like are available as sensor elements (photosensitive elements) that detect infrared rays, and compound semiconductors are mainly used.

In general, a technical trend of such a sensor element array including a plurality of sensor elements is increase in resolution, and the number of pixels inside an array sensor tends to increase. However, for example, for infrared imaging apparatuses, in terms of diffraction limit of the wavelength of light to be used, it is difficult to reduce the size of a pixel, and therefore, the size of the entire array sensor (sensor element array) tends to increase. In contrast, for compound semiconductors, it is difficult to fabricate uniform elements in a large area. In the case where a large sensor element array is simply fabricated, sensitivity unevenness occurs in a sensor element array surface, which may cause a deterioration of the image quality.

Various suggestions have been made as techniques for reducing sensitivity unevenness in a sensor element array.

As described above, in the case where a sensor element array with a large element area is fabricated, sensitivity unevenness in the sensor element array may occur. In order to avoid this, a technique for changing driving conditions for an array sensor has been suggested. That is, a technique for dividing an array sensor (sensor element array) into a plurality of regions and causing the sensor elements to operate under different driving conditions, without driving the entire array sensor under the same condition, has been suggested. Captured image data is subjected to correction processing for sensitivity and offset and then output. Therefore, uniform output image data are able to be obtained throughout the sensor element array.

However, with this technique, for example, in the case where temperature inside a camera changes after two-point correction is performed, the amount of infrared ray emitted from inside the camera or a lens changes, resulting in offset deviation. Therefore, a problem occurs in that a borderline before correction appears in an output image. That is, in a border part between driving conditions, driving conditions for sensor elements change discontinuously. Therefore, due to disturbances such as fluctuations of temperature of the entire imaging apparatus, correction processing may not be performed properly, and the quality of an output image may be degraded.

The followings are reference documents.
[Document 1] Japanese Laid-open Patent Publication No. 10-304251,
[Document 2] Japanese Laid-open Patent Publication No. 2015-056700,
[Document 3] Japanese Laid-open Patent Publication No. 2001-086518,
[Document 4] Japanese Laid-open Patent Publication No. 2009-295841, and
[Document 5] Japanese Laid-open Patent Publication No. 2010-056874.

SUMMARY

According to an aspect of the invention, an array sensor includes a sensor element array that includes a plurality of sensor elements, a signal processing circuit array that includes a plurality of signal processing circuits coupled to the corresponding sensor elements, and a resistor network that supplies bias voltages to the corresponding signal processing circuits, wherein different voltages are applied to at least two voltage application nodes in the resistor network.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First, before describing an array sensor and an imaging apparatus according to an embodiment, an example of an array sensor, an imaging apparatus, and a power supply control circuit and problems thereof will be explained with reference to FIGS. 1 to 4 and FIGS. 5A to 5C.

Figure 1:
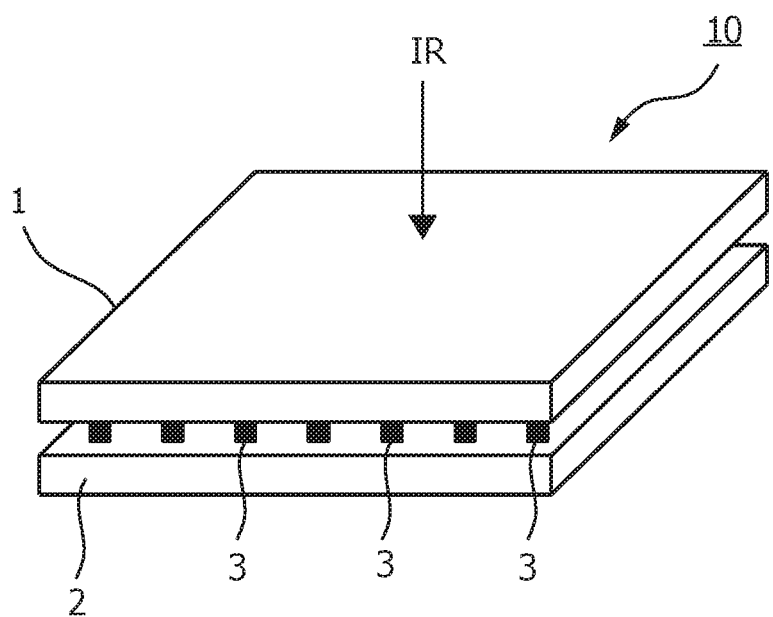
FIG. 1 is a diagram schematically illustrating an example of an array sensor.
Figure 2:
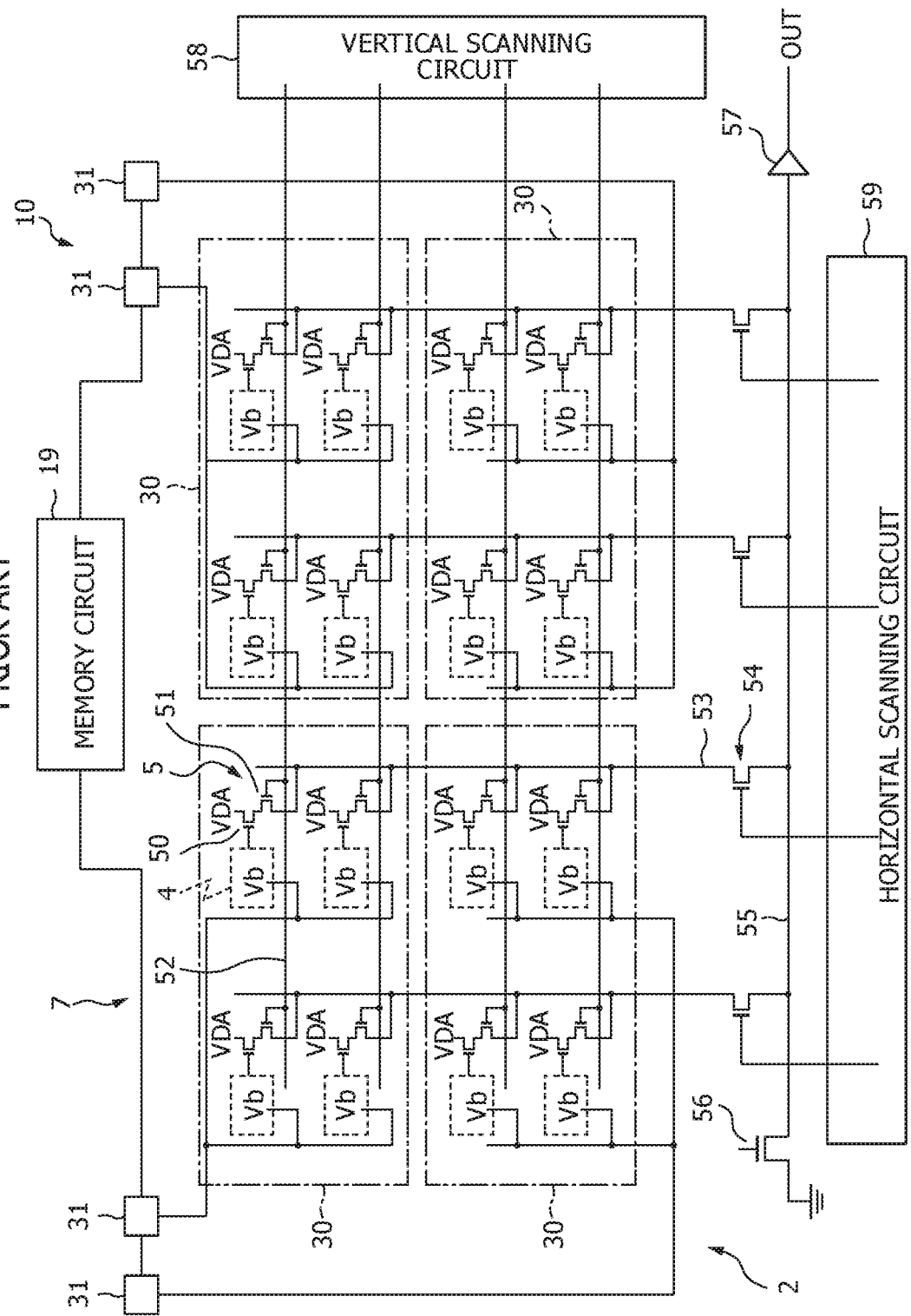
FIG. 2 is a block diagram illustrating an example of a signal processing circuit array in the array sensor illustrated in FIG. 1.
Figure 3:
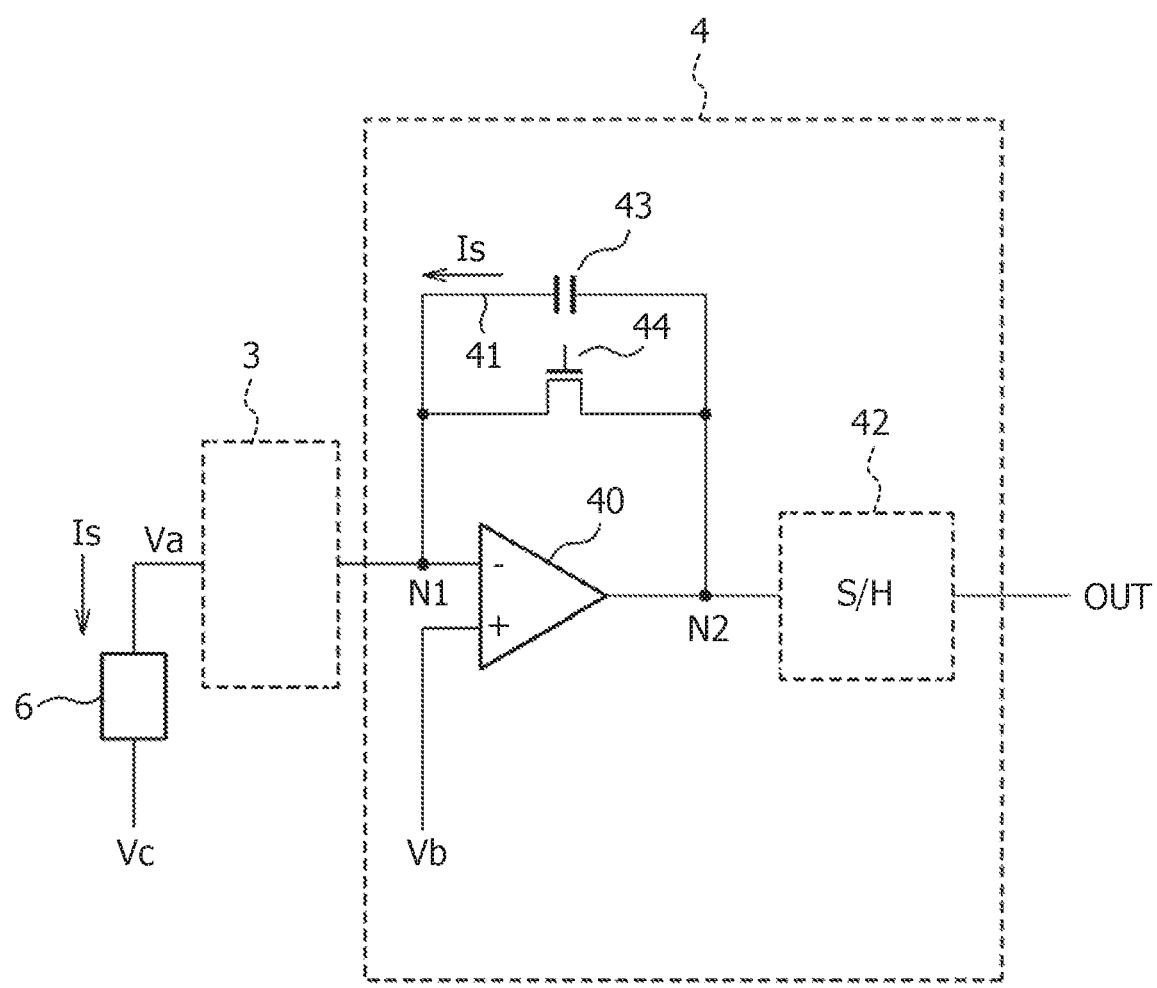
FIG. 3 is a diagram for explaining an example of a signal processing circuit in the signal processing circuit array illustrated in FIG. 2.

FIG. 1 is a diagram schematically illustrating an example of an array sensor. FIG. 2 is a block diagram illustrating an example of a signal processing circuit array in the array sensor illustrated in FIG. 1. FIG. 3 is a diagram for explaining an example of a signal processing circuit in the signal processing circuit array illustrated in FIG. 2.

As illustrated in FIG. 1, an array sensor 10 is, for example, a visible light or InfraRed (IR) imaging device and includes a sensor element array 1 including a plurality of sensor elements (photosensitive elements) and a signal processing circuit array 2 including, as elements, signal processing circuits connected to the sensor elements. The sensor element array 1 and the signal processing circuit array 2 are electrically connected via a conductive metal bump (for example, In bump) 3.

The sensor element array 1 is a photoelectric conversion element array (two-dimensional sensor element array) in which a plurality of photoelectric conversion elements (sensor elements) that generate electrical signals (signal currents) in response to input light are formed in a grid shape. For example, the sensor element array 1 converts an incident infrared ray (IR) into an electrical signal to obtain an image signal. The infrared sensor element array 1 may be an array obtained by forming a plurality of HgCdTe photodiodes on an HgCdTe substrate. For example, the sensor element array 1 may be an array obtained by forming quantum well sensor elements on a gallium arsenide (GaAs) substrate.

As the infrared sensor element array 1 of a quantum well type, for example, an array that includes an n-GaAs lower contact layer, an aluminum gallium arsenide (AlGaAs)/GaAs multiple quantum well (Multi Quantum Well (MQW)) layer, an n-GaAs upper contact layer having on the surface thereof a diffraction grating groove for an optical coupler, an ohmic electrode formed on the n-GaAs upper contact layer, a mirror electrode serving as part of the optical coupler formed on the surface thereof, and a bump base electrode formed on the mirror electrode that are arranged on a GaAs substrate and is separated in a matrix shape by element separation grooves may be used. It is obvious that embodiments described later are not limited to the infrared array sensor 10.

As illustrated in FIG. 2, the signal processing circuit array 2 includes a plurality of signal processing circuits (input circuits) 4 that receive electrical signals output from infrared sensor elements (6) and amplify the electrical signals, reading circuits 5 that read outputs from the signal processing circuits 4 to the outside, and the like. The signal processing circuit array 2 is formed on, for example, a silicone (Si) substrate, and electrical signals converted from infrared rays are input to the signal processing circuits 4 from the infrared sensor elements 6. The plurality of signal processing circuits 4 are arranged in a matrix shape in positions associated with the plurality of infrared sensor elements 6.

For example, the signal processing circuit array 2 is divided into a plurality of regions (blocks) and applies different bias voltages Vb to the infrared sensor elements 6 of the infrared array sensor 10 that is divided into a plurality of regions in association with the plurality of regions of the signal processing circuit array 2. That is, for example, a relatively low bias voltage is applied to an infrared sensor element 6 in a high sensitivity region in which a large amount of signal current flows, whereas a relatively high bias voltage is applied to an infrared sensor element 6 in a low sensitivity region in which a small amount of signal current flows. Accordingly, variations of signal current in the infrared array sensor 10 (chip surface) are reduced, and sensitivity unevenness in a captured image in the infrared array sensor 10 is reduced. In FIG. 2, division into four regions is illustrated. However, for example, division into nine regions, twelve regions, sixteen regions, and so on may be performed.

As illustrated in FIG. 3, the infrared sensor elements 6 in the sensor element array 1 are connected to the signal processing circuits 4 in the signal processing circuit array 2 with the conductive bumps 3 therebetween. The signal processing circuits 4 are circuits that convert current Is flowing, by incident infrared rays, to the infrared sensor elements 6 into voltage and output the voltage. The signal processing circuits 4 are integrating circuits that each output, as an output voltage, a difference between a value obtained by integrating the current Is with time (=∫Isdt/capacitance of a capacitor 43) and Va.

That is, the signal processing circuits 4 each includes an operational amplifier 40, a feedback loop 41, a sample-hold circuit (S/H circuit) 42. The operational amplifier 40 outputs, through an output terminal N2, an infinite multiple of a differential voltage between an input voltage input to an input terminal N1 and a reference voltage (bias voltage for controlling the output amount of the infrared sensor elements 6) Vb as an output voltage. The feedback loop 41 is arranged between the input terminal N1 and the output terminal N2 and includes the capacitor 43 as a capacitive element and a reset transistor 44 that short-circuits across the capacitor 43. The S/H circuit 42 samples and holds the output voltage of the output terminal N2 of the operational amplifier 40.

The infrared sensor element 6 is connected to an input side of the signal processing circuit 4 (the input terminal N1 of the operational amplifier 40) with the conductive bump 3 therebetween, and a gate of a source-follower transistor 50 of the reading circuit 5 is connected to an output side of the signal processing circuit 4 (output side of the S/H circuit 42; OUT). The bias voltage Vb is supplied to the signal processing circuit 4. For example, a voltage Vc of a common electrode is supplied on the opposite side of the infrared sensor element 6.

In the signal processing circuit 4, an output voltage corresponding to the amount of current flowing to the infrared sensor element 6 by an incident infrared ray is output through the output terminal N2 of the operational amplifier 40. Furthermore, starting and ending timings of an integration period for integrating the currents Is flowing to the infrared sensor element 6 by incident infrared rays may be determined based on a timing for electrically connecting the reset transistor 44 and deleting electric charge of the capacitor 43.

The reading circuits 5 are circuits that sequentially read outputs of the signal processing circuits 4 and are connected to the signal processing circuits 4. The reading circuits 5 include, for example, a plurality of source-follower circuits 50 that operate in accordance with outputs of the signal processing circuits 4, a plurality of row selection transistors 51, a plurality of row lines 52, a plurality of column lines (output lines) 53, and a plurality of column selection transistors 54. The reading circuits 5 also include, for example, a reading line (output line) 55, a load transistor 56, an amplifier (output amplifier) 57, a vertical scanning circuit 58, and a horizontal scanning circuit 59.

Gates of the source-follower circuits 50 are connected to the plurality of signal processing circuits 4. Furthermore, drains of the source-follower circuits 50 are connected to a power supply, which is not illustrated in FIG. 2, and a power supply voltage VDA is supplied to the drains of the source-follower circuits 50. The row selection transistors 51 are connected to sources of the source-follower circuits 50, and the row lines 52 are connected to gates of the row selection transistors 51 in corresponding rows.

The column lines 53 are connected to the source-follower circuits 50 in corresponding columns with the row selection transistors 51 therebetween, and the column selection transistors 54 are connected to the plurality of column lines 53. Furthermore, the reading line 55 is connected to all the column selection transistors 54.

The vertical scanning circuit 58 is connected to all the row lines 52. The vertical scanning circuit 58 sequentially drives the row lines 52 to perform electrical connection/electrical non-connection of the row selection transistors 51 connected to the row lines 52. Furthermore, the horizontal scanning circuit 59 is connected to all the column selection transistors 54. The horizontal scanning circuit 59 sequentially drives the column selection transistors 54 to perform electrical connection/electrical non-connection of the column selection transistors 54.

One end of the reading line 55 is connected to an output terminal OUT with the amplifier 57 therebetween, and the other end of the reading line 55 is connected to a ground potential (GND) with the load transistor 56 therebetween. When a row line 52 is selected by the vertical scanning circuit 58, row selection transistors 51 connected to the selected row line 52 enter an electrically connected state (ON state). When the row selection transistors 51 enter the electrically connected state, output signals from infrared sensor elements (individual pixels) 6 are output through the signal processing circuits 4, the source-follower circuits 50, and the row selection transistors 51 to the column lines 53.

In contrast, when column selection transistors 54 are selected by the horizontal scanning circuit 59, the selected column selection transistors 54 enter an electrically connected state (ON state). When the column selection transistors 54 enter the electrically connected state, output signals output to individual column lines 53 as described above are output to the reading line 55 via the column selection transistors 54. The output signals output to the reading line 55 are output to the output terminal OUT via the amplifier 57.

Figure 4:
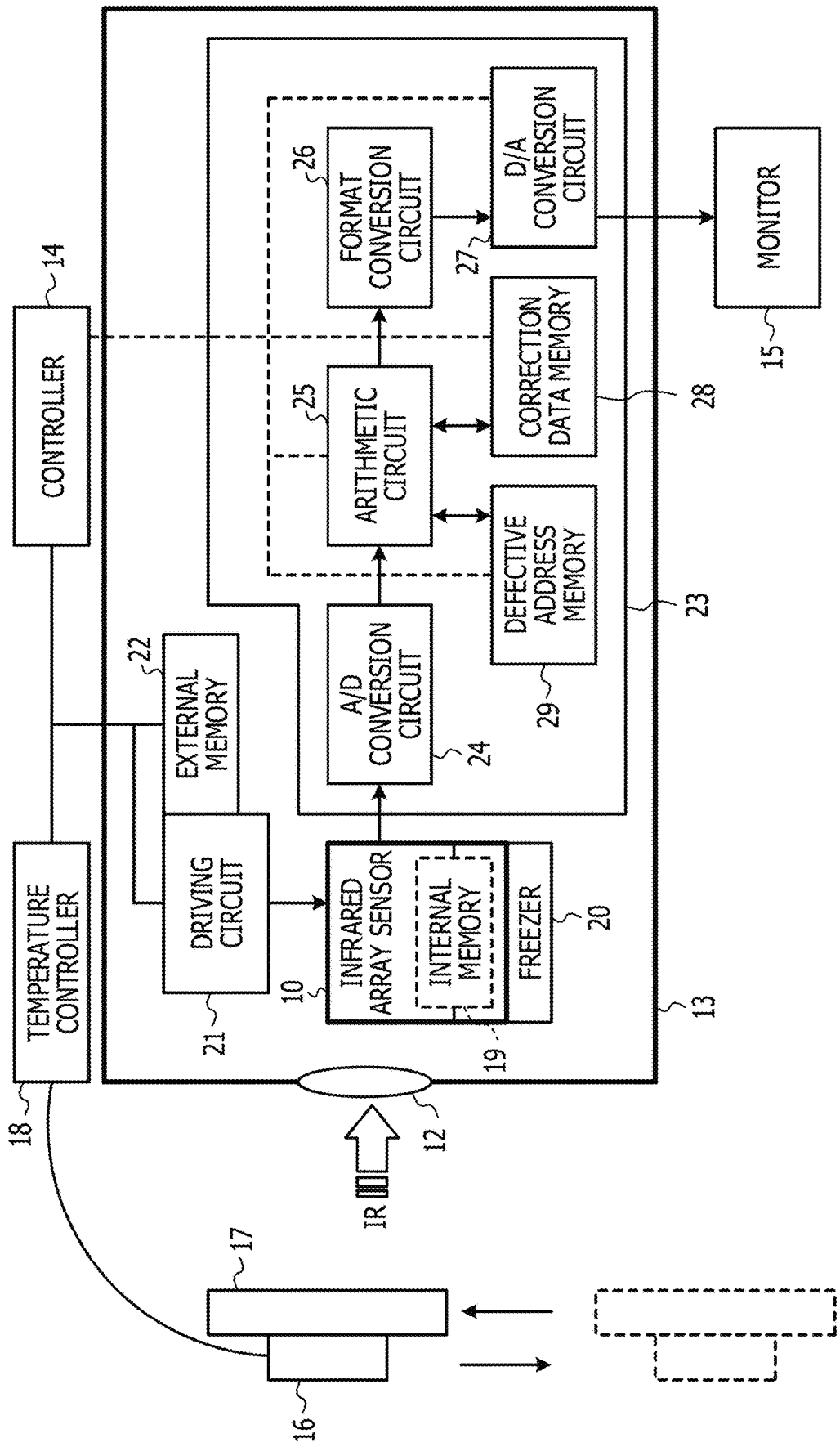
FIG. 4 is a block diagram illustrating an example of an imaging apparatus to which the array sensor illustrated in FIG. 1 is applied.

FIG. 4 is a block diagram illustrating an example of an imaging apparatus to which the array sensor illustrated in FIG. 1 is applied and illustrates an example of an infrared imaging apparatus 11 to which the infrared array sensor 10 is applied. As illustrated in FIG. 4, the infrared imaging apparatus 11 includes a casing 13 that contains the infrared array sensor 10 and includes a lens (optical system) 12 for causing an infrared ray (IR) to be incident to the infrared array sensor 10, and a controller (CPU) 14 that controls the entire apparatus. The infrared imaging apparatus 11 further includes a monitor 15 that displays a captured image, an infrared light source 17 including a Peltier element 16, and a temperature controller 18 for controlling the Peltier element 16.

The infrared array sensor (imaging device) 10 that includes a memory circuit (internal memory) 19, and a freezer (chiller) 20 that cools down the infrared array sensor 10 to, for example, a liquid nitrogen temperature, are arranged inside the casing 13. Furthermore, inside the casing 13, a driving circuit (including an external memory 22) 21 that drives the infrared array sensor 10 and an image processing circuit 23 that processes an output signal from the infrared array sensor 10 are arranged. The driving circuit 21 and the image processing circuit 23 are controlled by the controller 14. The driving circuit 21 and the image processing circuit 23 control the array sensor 10 and form a control system that receives and processes output from the array sensor 10 and generate an output image.

The image processing circuit 23 includes an A/D conversion circuit 24 that converts an output signal (analog signal) from the infrared array sensor 10 into a digital signal and an arithmetic circuit 25 that performs arithmetic processing for the output signal (digital signal) from the A/D conversion circuit 24. The image processing circuit 23 further includes a format conversion circuit 26 that converts image data generated by the arithmetic circuit 25 into a specific format and a D/A conversion circuit 27 that converts the output signal (digital signal) from the format conversion circuit 26 into an analog signal. The output signal (analog signal) from the D/A conversion circuit 27 is transmitted to the monitor 15, so that a captured image is displayed on the monitor 15.

The arithmetic circuit 25 performs specific correction processing for a digital image, based on correction data stored in a correction data memory 28. The correction processing is, for example, correction processing for a gain, offset, and the like of each of the infrared sensor elements 6. Furthermore, the arithmetic circuit 25 also performs processing such as replacing image data of a defective address with image data of an adjacent pixel, based on information on a defective pixel in the infrared array sensor 10 stored in a defective address memory 29.

The infrared light source (infrared light source for calibration) 17 is to apply uniform infrared rays in a surface of the infrared array sensor 10 by temperature control by the Peltier element 16. As the infrared light source 17, for example, a metal plate whose surface is painted in matte black so that it may be regarded as a black body may be used, and the temperature of the surface of the metal plate may be controlled by the Peltier element 16. The infrared light source 17 is movable. At the time of calibration, the infrared light source 17 is placed in front of the lens 12, so that the infrared light source 17 may be evacuated outside an optical path of an infrared ray that is emitted from an imaging target at the time of imaging and is incident to the infrared array sensor 10 through the lens 12 (see broken lines in FIG. 4). The infrared light source 17 is also used for adjusting the gain and offset of each of the infrared sensor elements 6.

Figure 5A:
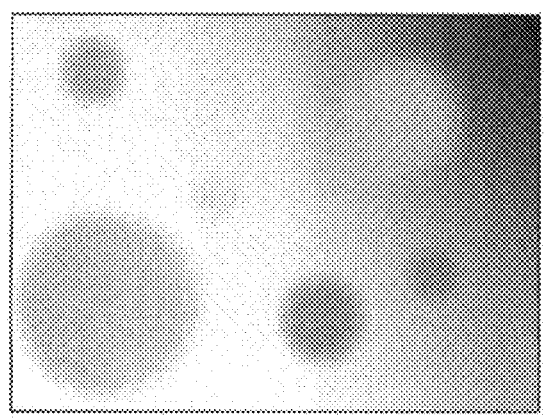
FIGS. 5A, 5B, and 5C are diagrams for explaining an image captured by the imaging apparatus illustrated in FIG. 4.
Figure 5B:
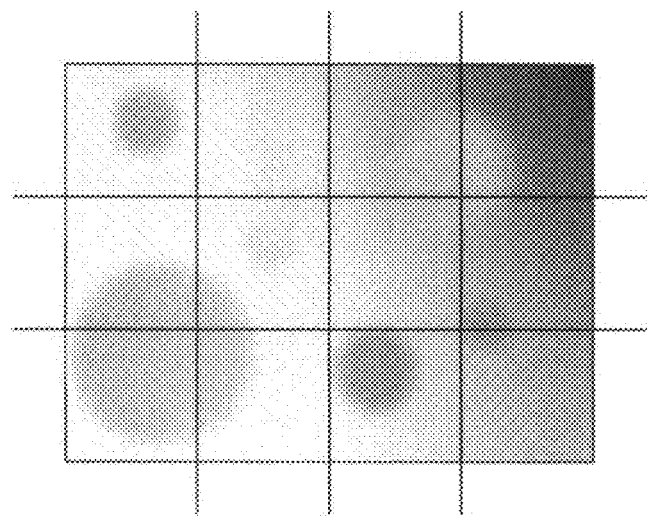
Figure 5C:
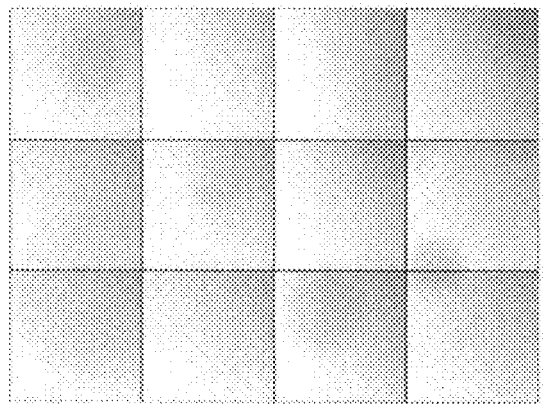

FIGS. 5A, 5B, and 5C are diagrams for explaining an image captured by the imaging apparatus illustrated in FIG. 4. FIG. 5A illustrates an example of an image in which sensitivity variations (sensitivity unevenness) occur. FIG.

5B illustrates a state in which the image illustrated in FIG. 5A is divided into a plurality of (twelve) regions. FIG. 5C illustrates a state in which sensitivity unevenness is reduced by using the imaging apparatus illustrated in FIG. 4. In the entire array sensor 10, it is difficult to improve the uniformity of compound semiconductor materials used as photosensitive materials, and, for example, variations in sensitivity occur among the infrared sensor elements 6 of the infrared array sensor 10. As a result, for example, sensitivity unevenness occurs in an image captured by the array sensor 10, as illustrated in FIG. 5A, which causes a deterioration of the image quality. That is, even if uniform light is incident, a large amount of signal current flows to a high-sensitivity infrared sensor element (pixel) and a small amount of signal current flows to a low-sensitivity infrared sensor element. Therefore, variations in the signal current cause nonuniformity in the chip surface.

In this case, there is an upper limit of current that may be handled by the signal processing circuits in the infrared array sensor, and therefore, output of a high-sensitivity infrared sensor element to which a large amount of signal current flows falls within a dynamic range. That is, when the bias voltages of all the infrared sensor elements 6 in the infrared sensor element array 1 are the same, the bias voltage for controlling the amount of output from a low-sensitivity infrared sensor element to which a small amount of signal current flows decreases. Thus, a very dark pixel (defective pixel) locally appears, and the image quality of a captured image is deteriorated.

In the imaging apparatus (infrared imaging apparatus 11) explained with reference to FIGS. 1 to 4, the infrared array sensor 10 is divided into a plurality of (for example, twelve) regions, and bias voltages Vb for controlling the amount of output from the infrared sensor elements 6 are separately controlled for individual regions, as illustrated in FIG. 5B. Accordingly, bias voltages Vb that are different for divided regions are applied to the infrared sensor elements 6 included in the regions. That is, a relatively low bias voltage is applied to a region in which a large amount of current flows (high-sensitivity region), and a relatively high bias voltage is applied to a region in which a small amount of signal current flows (low-sensitivity region). Accordingly, as illustrated in FIG. 5C, variations of signal current in the chip surface (infrared array sensor 10) are reduced to achieve uniformity. That is, sensitivity unevenness in a captured image in the infrared array sensor 10 is reduced, and the image quality may thus be improved. An array sensor and an imaging apparatus are not limited to the infrared array sensor 10 and the infrared imaging apparatus 11. It is obvious that, for example, an array sensor and an imaging apparatus in which it is difficult to fabricate uniform elements in a large area to which compound semiconductors are applied are also possible.

As described above, by dividing an array sensor (sensor element array) into a plurality of regions and causing the sensor elements to operate under different driving conditions, captured image data on which correction processing for sensitivity and offset has been performed may be output, thus an output image with uniform image quality being obtained. However, with this technique, for example, driving conditions for sensor elements change discontinuously in a border part between driving conditions. Therefore, due to disturbances such as fluctuations of temperature of the entire imaging apparatus, correction processing may not be performed properly, resulting in the deterioration of the image quality of an output image.

Hereinafter, an array sensor and an imaging apparatus according to an embodiment will be described in detail with reference to attached drawings. As the sensor element array 1, the array sensor (infrared array sensor) 10, and the imaging apparatus (infrared imaging apparatus) 11 according to this embodiment, those explained with reference to FIGS. 1 to 4 may be substantially applied. That is, in this embodiment, for example, in a case where division into a plurality of regions is performed and bias voltages are controlled, deterioration in the image quality in a border part between regions may be suppressed, and features described above may be applied to configuration features other than a configuration of a resistor network described below.

Figure 6:
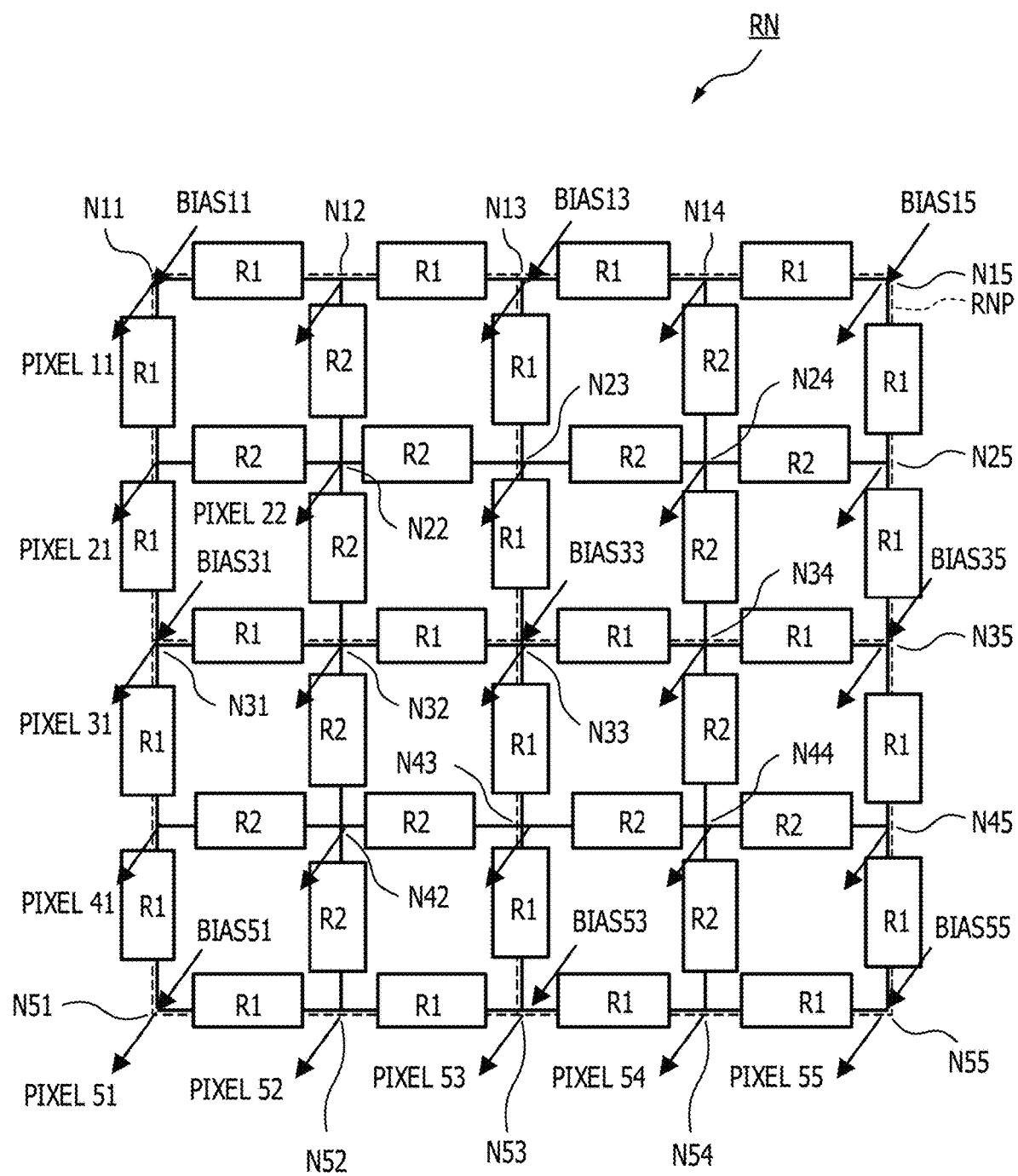
FIG. 6 is a diagram for explaining an example of an array sensor according to an embodiment.
Figure 7:
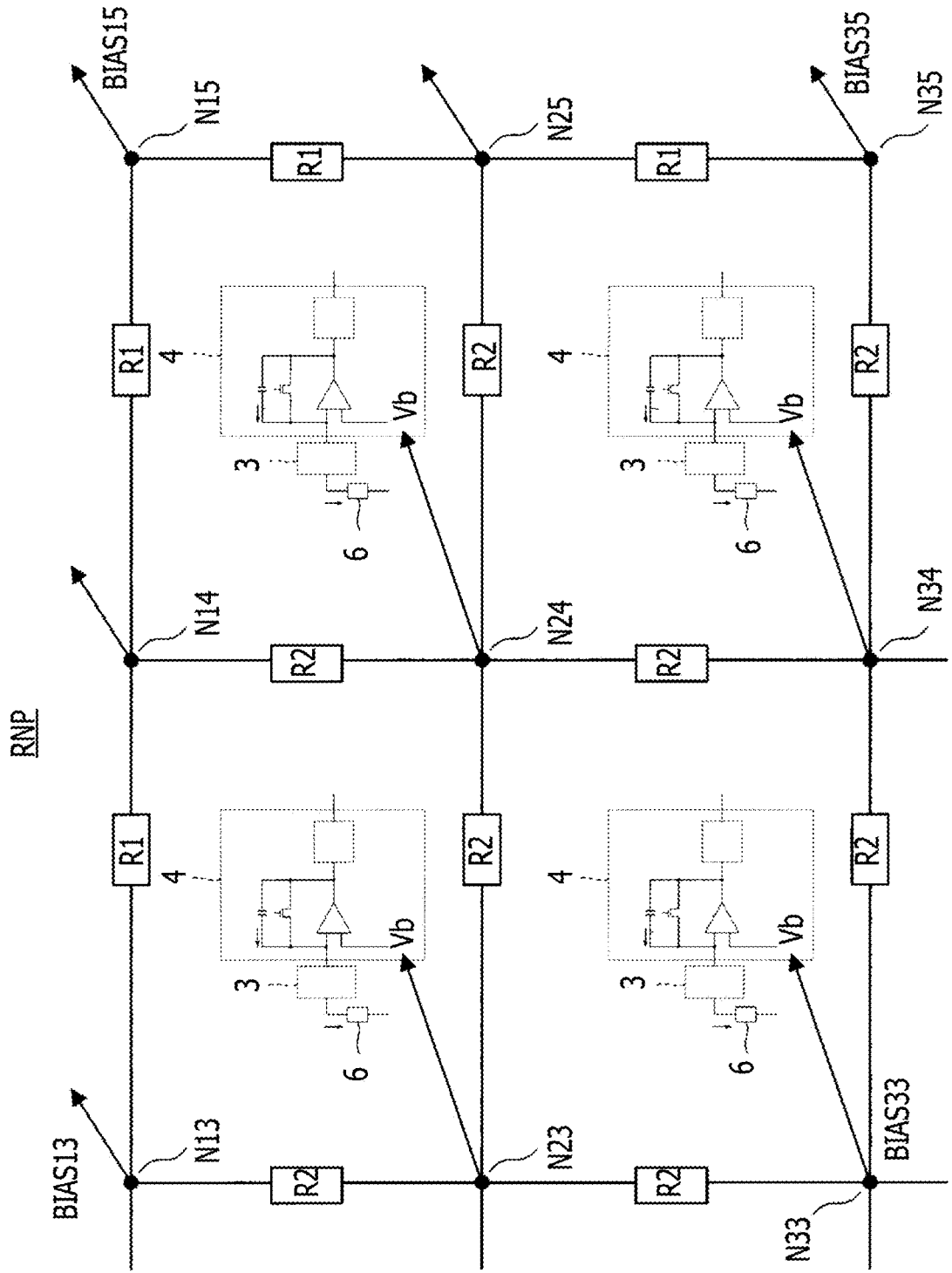
FIG. 7 is a diagram for explaining part of the array sensor illustrated in FIG. 6.

FIG. 6 is a diagram for explaining an example of an array sensor according to this embodiment and illustrates an example of a resistor network RN. FIG. 7 is a diagram for explaining part of the array sensor illustrated in FIG. 6 and illustrates an example of a partial region (partial resistor network) RNP in the resistor network RN illustrated in FIG. 6. The region RNP illustrated in FIG. 7 corresponds to a region including bias voltage supply nodes N13, N14, N15, N23, N24, N25, N33, N34, and N35 in the resistor network RN illustrated in FIG. 6.

The resistor network RN illustrated in FIG. 6 corresponds to the sensor element array 1 including sensor elements 6 of 5×5 pixels, that is, corresponds to the signal processing circuit array 2 including 5×5 signal processing circuits 4, and includes a plurality of resistor elements R1 and R2. The resistance of the resistor element R1 is smaller than the resistance of the resistor element R2. For example, in the case where the resistance of the resistor element R1 is set to 10 kΩ, the resistance of the resistor element R2 may be set to 10 MΩ. Alternatively, in the case where the resistance of the resistor element R1 is set to 1 kΩ, the resistance of the resistor element R2 may be set to 100 kΩ. The resistances of the resistor elements R1 and R2 described above are merely examples. For example, the resistances of the resistor elements R1 and R2 may be set to various values according to the characteristics of the sensor element array 1. However, R1 is sufficiently larger than R2.

The resistor network RN is to supply bias voltages Vb to the 5×5 signal processing circuits 4 and is formed in a 5×5 grid shape (matrix shape) based on the arrangement of the signal processing circuits 4. That is, intersections (nodes) of the 5×5 grid are bias voltage supply nodes N11 to N55 for supplying the bias voltages Vb to the signal processing circuits 4. The signal processing circuits 4 are similar to those explained with reference to FIG. 3 and are arranged for the corresponding sensor elements 6.

The resistor network RN illustrated in FIG. 6 corresponds to a region in which a 5×5 grid shape corresponding to the sensor element array 1 including sensor elements 6 of 5×5 pixels is divided into four regions: first to fourth regions (2×2: division into four). The first region includes the nodes N11, N12, N13, N21, N22, N23, N31, N32, and N33. The second region includes the nodes N13, N14, N15, N23, N24, N25, N33, N34, and N35. The third region includes the nodes N31, N32, N33, N41, N42, N43, N51, N52, and N53. The fourth region includes the nodes N33, N34, N35, N43, N44, N45, N53, N54, and N55. Therefore, the region (partial resistor network) RNP illustrated in FIG. 7 corresponds to the second region.

A bias voltage supply node at each corner of the first to fourth regions functions as a voltage application node that applies a specific voltage. For example, in the second region RNP illustrated in FIG. 7, bias voltages BIAS 13, BIAS 15, BIAS 33, and BIAS 35 are applied to the nodes N13, N15, N33, and N35, respectively. At least two first resistor elements R1 that are connected to adjacent bias voltage supply nodes are connected to the voltage application nodes N13, N15, N33, and N35 and no second resistor element R2 is connected to the voltage application nodes N13, N15, N33, and N35. Furthermore, at least one second resistor element R2 is connected to the bias voltage supply nodes N14, N23, N24, N25, and N34, which are not voltage application nodes.

That is, as illustrated in FIGS. 6 and 7, for example, three first resistor elements R1 are connected to the voltage application node N13, two first resistor elements R1 are connected to the voltage application node N15, four first resistor elements R1 are connected to the voltage application node N33, and no second resistor element R2 is connected to the voltage application node N13, N15, or N33. Furthermore, for example, two first resistor elements R1 and one second resistor element R2 are connected to the bias voltage supply node N14, which is not a voltage application node, two first resistor elements R1 and two second resistor element R2 are connected to the bias voltage supply node N23, and four second resistor elements R2 are connected to the bias voltage supply node N24. As described in detail later with reference to FIGS. 8A and 8B, for example, for unevenness in an image only in a row direction, different voltages are applied to different columns, and the same column thus has the same potential. In this case, at least one first resistor element R1 is connected to a voltage application node.

As described above, in the array sensor according to this embodiment, two types of resistor elements R1 and R2 having different resistances form the resistor network RN. For example, the first resistor elements R1 with a relatively small resistance set a frame of a region in which driving conditions are changed, and a finer mesh is formed of the second resistor elements R2 with a relatively large resistance in the region. The nodes in the matrix (grid) shape in the resistor network RN function as bias voltage supply nodes for supplying the bias voltages Vb to the corresponding signal processing circuits 4. Among the bias voltage supply nodes in the matrix shape, for example, a part corresponding to a knot of the first resistor elements R1 is defined as a voltage application node, and voltage for correcting unevenness in an output image caused by sensitivity unevenness, offset deviation, or the like of the sensor element array is applied to the voltage application node. Regarding application of voltage to a voltage application node, different voltages are applied to at least two voltage application nodes. At this time, at least one second resistor element R2 is connected to a node (a bias voltage supply node which is not a voltage application node) adjacent to a voltage application node.

Accordingly, from intersections (bias voltage supply nodes) in the resistor network RN formed by the first resistor elements R1 and the second resistor elements R2, driving voltages (bias voltages Vb) are supplied to the signal processing circuits 4 for driving the corresponding pixels. For example, on a square frame in vertical and horizontal directions (column and row directions) formed by the first resistor element R1, voltages linearly vary with respect to corresponding bias voltages applied from the outside. Furthermore, in a resistor network formed by the second resistor elements R2 surrounded by the first resistor elements R1, voltages continuously vary from a border part. Accordingly, driving voltages may be continuously varied in a surface of the array sensor 10. Even if offset deviation or the like occurs, in the final output image after two-point correction, generation of a borderline caused by a border of driving voltages may be avoided.

As described above, with the array sensor according to this embodiment, instead of discontinuously applying voltages for determining driving conditions of the array sensor for individual regions, by continuously varying the voltages, even if a temperature change or offset deviation occurs, appearance of a clear borderline in an output image may be avoided. That is, with the array sensor according to this embodiment, even if a temperature change or offset deviation occurs, a deterioration in the quality of an output image may be suppressed.

Figure 8A:
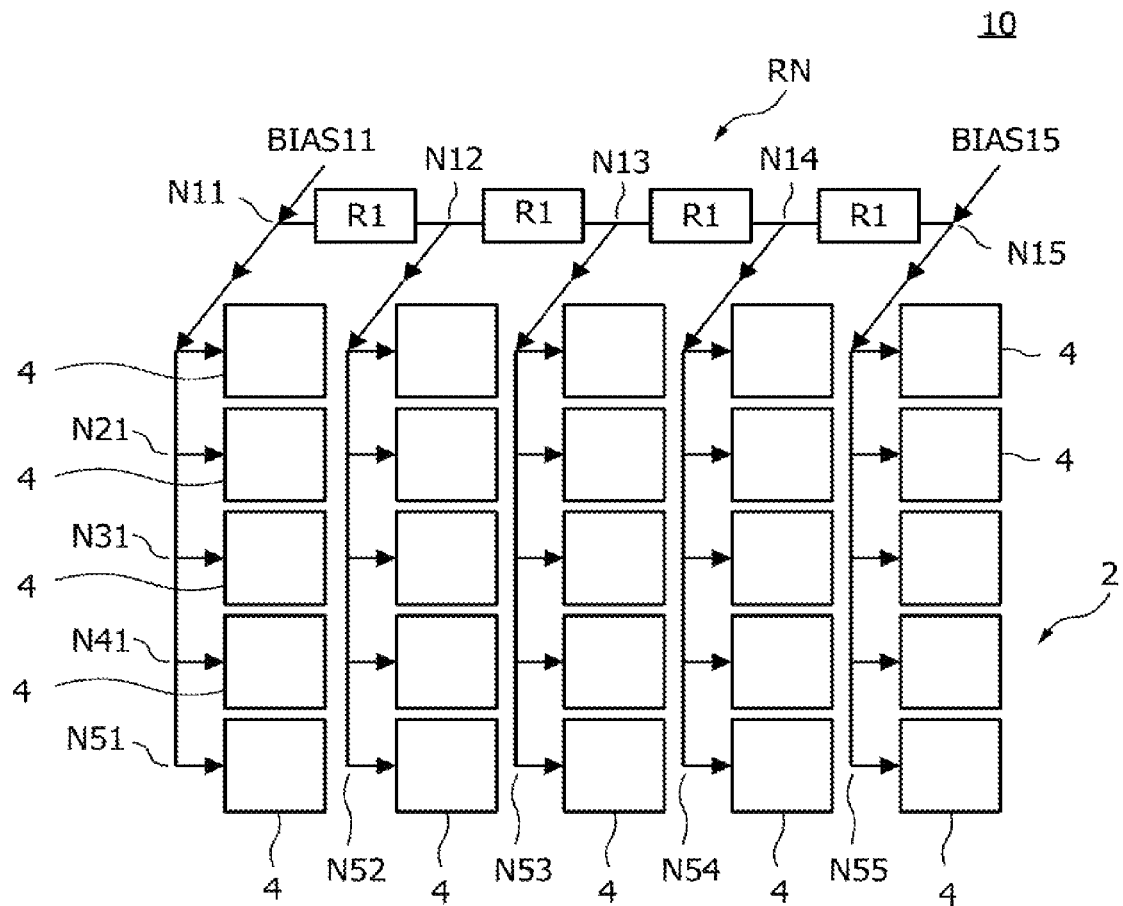
FIGS. 8A and 8B are diagrams for explaining an array sensor according to a first embodiment.
Figure 8B:
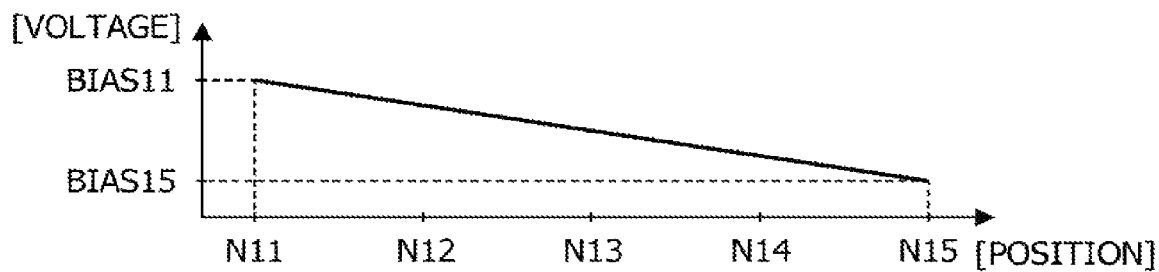
Figure 9A:
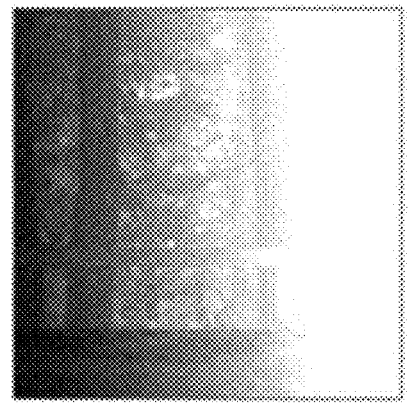
FIGS. 9A, 9B, and 9C are diagrams for explaining an image captured by an example of an imaging apparatus to which the array sensor according to the first embodiment illustrated in FIG. 8A is applied.
Figure 9B:
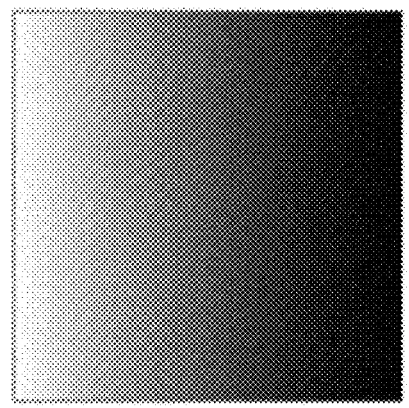
Figure 9C:
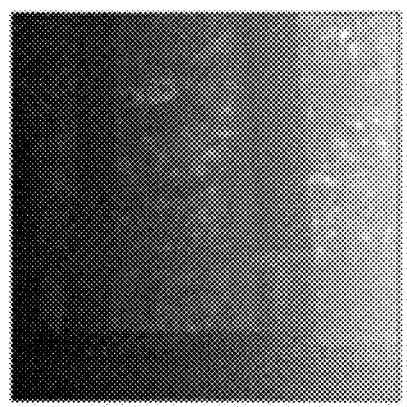

FIGS. 8A and 8B are diagrams for explaining an array sensor according to a first embodiment. FIGS. 9A, 9B, and 9C are diagrams for explaining an image captured by an example of an imaging apparatus to which the array sensor according to the first embodiment illustrated in FIGS. 8A and 8B is applied. FIG. 8A illustrates the signal processing circuit array 2 and the resistor network RN. FIG. 8B illustrates the relationship of a position in an X (row) direction of the resistor network RN illustrated in FIG. 8A and bias voltages Vb for individual pixels. Furthermore, FIG. 9A illustrates a captured image in the case where the array sensor is operated under uniform driving conditions (same bias voltage Vb). FIG. 9B illustrates characteristics of the array sensor 10 according to the first embodiment to which the resistor network RN illustrated in FIG. 8A is applied (in-plane distribution of driving conditions in the first embodiment). FIG. 9C illustrates a captured image in the case where an object similar to that illustrated in FIG. 9A is captured with the array sensor 10 to which the resistor network RN illustrated in FIG. 8A is applied.

The array sensor according to the first embodiment illustrated in FIG. 8A is an example of a case where, for example, characteristics in which a large output difference between left and right appears (bright in a right part and dark in a left part) when imaging is performed under uniform driving conditions, as illustrated in FIG. 9A, are corrected. In the array sensor 10 according to the first embodiment, in the resistor network RN, a plurality of (four) first resistor elements R1 are connected in series and different voltages (the bias voltages BIAS 11 and BIAS 15) are applied to the nodes (voltage application nodes) N11 and N15 across the four first resistor elements R1. For example, a voltage of 2 V as the bias voltage BIAS 11 and a voltage of 1 V as the bias voltage BIAS 15 are applied. Accordingly, voltages decreasing from the bias voltage BIAS 11 to the bias voltage BIAS 15, as illustrated in FIG. 8B, are applied to the nodes (bias voltage supply nodes) N12, N13, and N14, which are different from the voltage application nodes N11 and N15 across the four first resistor elements R1, by the four first resistor elements R1 illustrated in FIG. 8A. It is obvious that voltages applied as the bias voltages BIAS 11 and BIAS 15 vary according to the characteristics of the array sensor 10.

The same voltage is applied to individual columns, that is, a voltage at the same level as the bias voltage BIAS 11 for the voltage application node N11 is applied to the bias voltage supply nodes N21, N31, N41, and N51. Furthermore, a voltage at the same level as the voltage for the bias voltage supply nodes N12 is applied to the bias voltage supply nodes N22, N32, N42, and N52. That is, in the array sensor according to the first embodiment, a plurality of (four) first resistor elements R1 with the same resistance are connected in series in the row (horizontal) direction, and the different bias voltages BIAS 11 and BIAS 15 are applied across the first resistor elements R1 (N11 and N15). Voltages are extracted from connection parts (end parts) of the first resistor elements R1 and are supplied in parallel to the driving circuits (signal processing circuits 4) for pixels in the column (vertical) direction.

Accordingly, the pixels in the column direction are driven under the same driving condition (bias voltage), and the pixels in the row direction are driven under driving conditions that linearly vary as illustrated in FIG. 8B. The number of the first resistor elements R1 may be increased to a number corresponding to the number of pixels in the row direction of the sensor element array, and a plurality of columns may be driven under the same driving condition.

Regarding setting for driving conditions, for example, first, the bias voltages BIAS 11 and BIAS 15 across the resistor column of the first resistor elements R1 (a plurality of first resistor elements R1 that are connected in series) are set to the same voltage level. Furthermore, output before correction of the sensor element array 1 is measured for individual bias voltages, and, for example, appropriate driving voltages on a right end and a left end are determined. Moreover, the predetermined bias voltages are applied to the both ends (N11 and N15) of the first resistor elements R1, and conditions for driving the entire sensor element array 1 at appropriate driving voltages are set. Then, uniform objects emitting two types of light amount are imaged, an offset and a gain for each pixel are calculated, two-point correction is performed, and the final output image is obtained.

Accordingly, the array sensor 10 according to the first embodiment is able to obtain, for example, a high-quality captured image, as illustrated in FIG. 9C, without a clear borderline or the like being generated, by performing compensation (correction) as illustrated in FIG. 9B for the captured image illustrated in FIG. 9A under uniform driving conditions.

Figure 10:
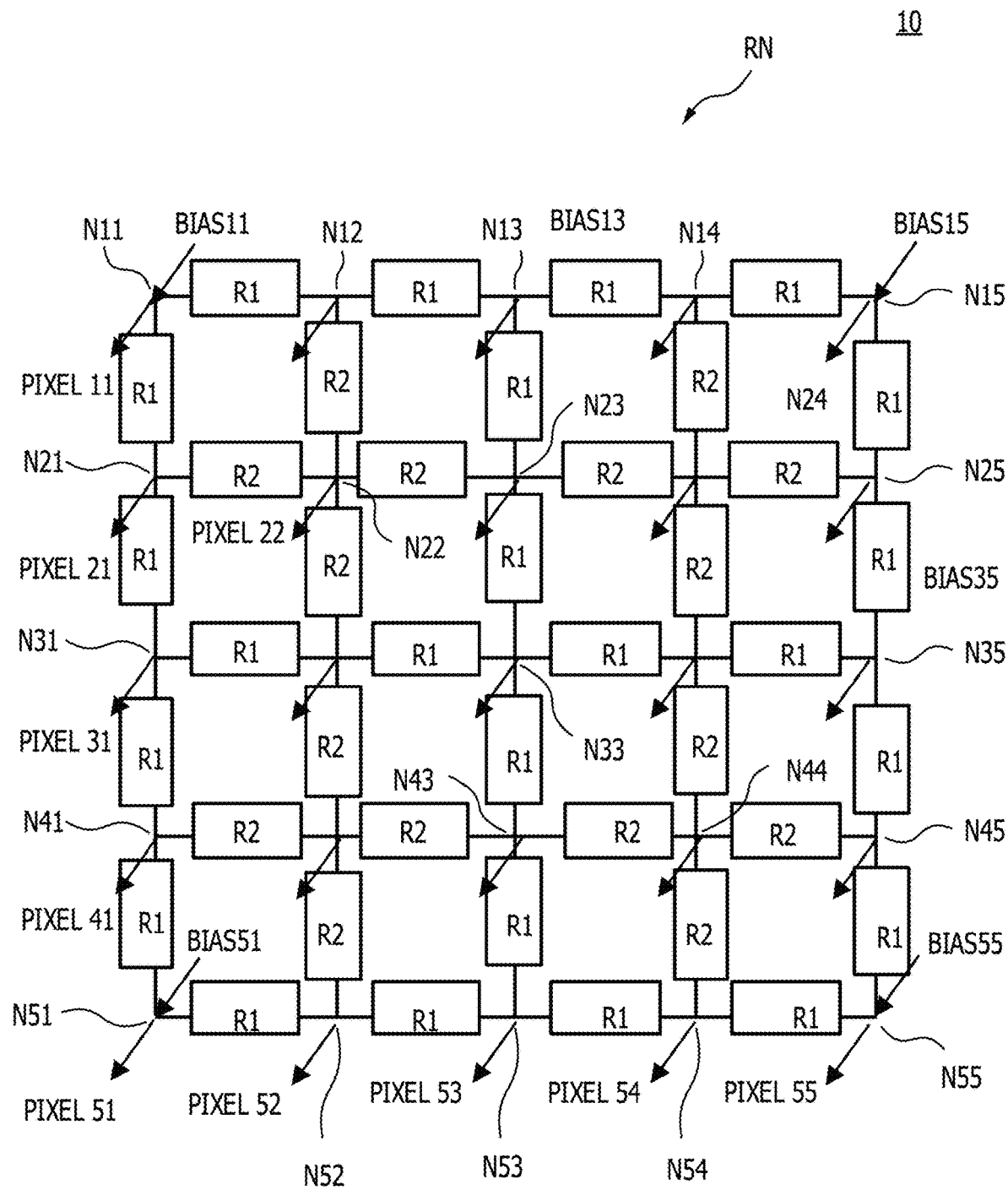
FIG. 10 is a diagram for explaining an array sensor according to a second embodiment.
Figure 11A:
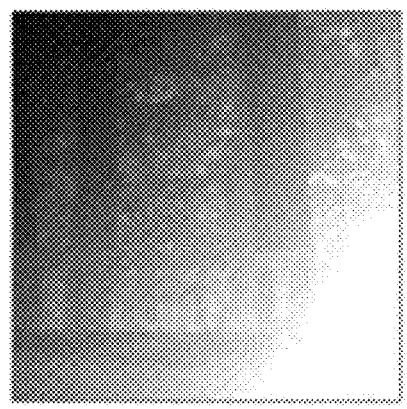
FIGS. 11A, 11B, and 11C are diagrams for explaining an image captured by an example of an imaging apparatus to which the array sensor according to the second embodiment illustrated in FIG. 10 is applied.
Figure 11B:
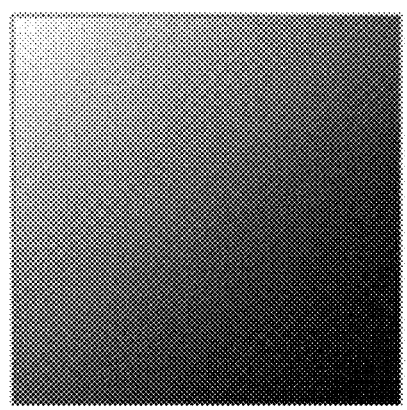
Figure 11C:
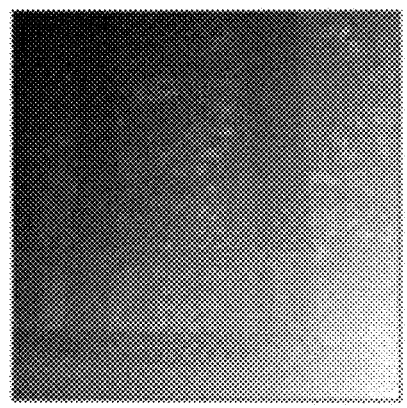

FIG. 10 is a diagram for explaining an array sensor according to a second embodiment and illustrates the resistor network RN. FIGS. 11A, 11B, and 11C are diagrams for explaining an image captured by an example of an imaging apparatus to which the array sensor according to the second embodiment illustrated in FIG. 10 is applied. FIG. 11A illustrates a captured image in the case where the array sensor is operated under uniform driving conditions. FIG. 11B illustrates characteristics of the array sensor 10 according to the second embodiment to which the resistor network RN illustrated in FIG. 10 is applied (in-plain distribution of driving conditions in the second embodiment). FIG. 11C illustrates a captured image in the case where an object similar to that illustrated in FIG. 11A is imaged with the array sensor 10 to which the resistor network RN illustrated in FIG. 10 is applied.

The array sensor according to the second embodiment illustrated in FIG. 10 is an example of a case where, for example, characteristics in which a large output difference in a diagonal direction appears (dark at an upper left end, bright at a lower right end, and the brightness varies in a direction from upper left to lower right) when imaging is performed under uniform driving conditions, as illustrated in FIG. 11A, are corrected. In the array sensor 10 according to the second embodiment, in the resistor network RN, which corresponds to the sensor element array 1 including the sensor elements 6 of 5×5 pixels illustrated in FIG. 6, the first resistor elements R1 are connected in series in the row direction and the column direction only in a frame part, and the second resistor elements R2 are connected in other parts. The frame part is formed by a plurality of outermost first resistor elements R1 in the row direction and the column direction.

As described above, the resistance of the first resistor elements R1 is set to a relatively small value (for example, 10 kΩ), whereas the resistance of the second resistor elements R2 is set to a relatively large value (for example, 10 MΩ).

That is, as illustrated in FIG. 10, in the resistor network RN in the second embodiment, the nodes N11, N12, N13, N14, and N15 in the first row and the nodes N51, N52, N53, N54, and N55 in the fifth row are connected with the first resistor elements R1 therebetween. Furthermore, the nodes N11, N21, N31, N41, and N51 in the first column and the nodes N15, N25, N35, N45, and N55 in the fifth column are connected with the first resistor elements R1 therebetween. The other nodes N22, N23, ..., and N44 are connected with the second resistor elements R2 therebetween.

Among the bias voltage supply nodes N11, N12, ..., and N55 of the 5×5 grid shape, the nodes N11, N15, N51, and N55 at four corners are voltage application nodes to which voltages are applied in the resistor network RN. For example, a voltage of 2 V to be applied as the bias voltage BIAS 11 to the node N11, a voltage of 1 V to be applied as the bias voltage BIAS 55 to the node N55, and a voltage of 1.5 V to be applied as the bias voltages BIAS 15 and BIAS 51 to the nodes N15 and N51 are set. As described above, voltages to be applied as the bias voltages BIAS 11, BIAS 15, BIAS 51, and BIAS 55 vary according to the characteristics of the array sensor 10.

Accordingly, the array sensor 10 according to the second embodiment is able to obtain, for example, a high-quality captured image, as illustrated in FIG. 11C, without a clear borderline or the like being generated, by performing compensation as illustrated in FIG. 11B for the captured image illustrated in FIG. 11A under uniform driving conditions.

Figure 12:
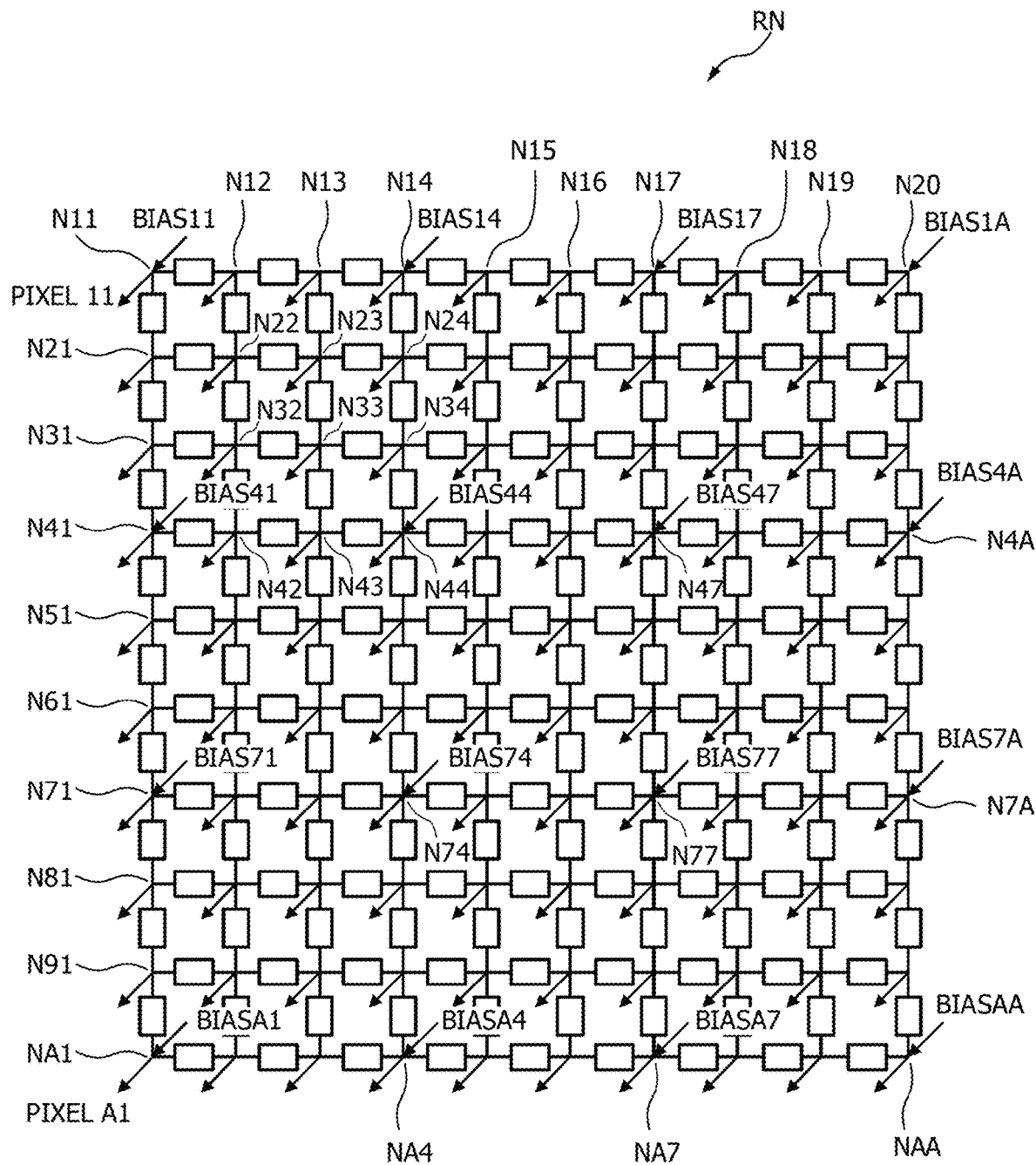
FIG. 12 is a diagram for explaining an array sensor according to a third embodiment.
Figure 13A:
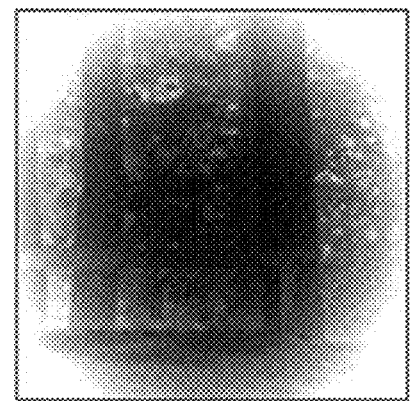
FIGS. 13A, 13B, 13C, and 13D are diagrams for explaining an image captured by an example of an imaging apparatus to which the array sensor according to the third embodiment illustrated in FIG. 12 is applied.
Figure 13B:
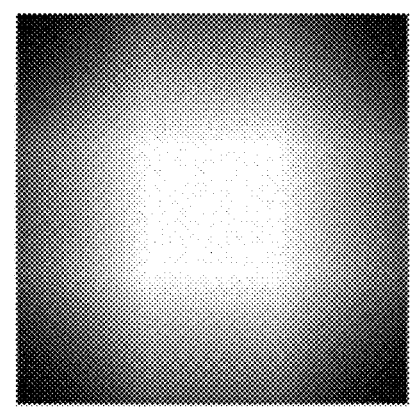
Figure 13C:
Figure 13D:
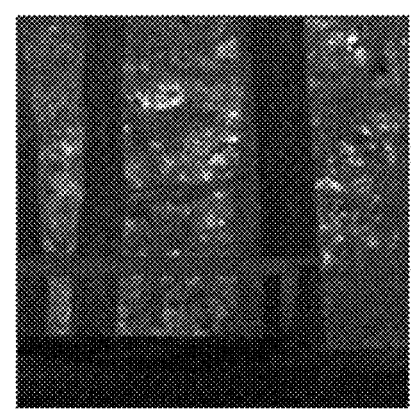

FIG. 12 is a diagram for explaining an array sensor according to a third embodiment and illustrates the resistor network RN. FIGS. 13A, 13B, 13C, and 13D are diagrams for explaining an image captured by an example of an imaging apparatus to which the array sensor according to the third embodiment illustrated in FIG. 12 is applied. FIG. 13A illustrates a captured image in the case where the array sensor is operated under uniform driving conditions. FIG. 13B illustrates characteristics of the array sensor 10 according to the third embodiment to which the resistor network RN illustrated in FIG. 12 is applied (in-plane distribution of driving conditions in the third embodiment). FIG. 13C illustrates a captured image in the case where an object similar to that illustrated in FIG. 13A is imaged with the array sensor 10 to which the resistor network RN illustrated in FIG. 12 is applied. FIG. 13D illustrates an output image obtained by performing two-point correction on the image illustrated in FIG. 13C.

The array sensor according to the third embodiment illustrated in FIG. 12 is an example of a case where, for example, characteristics in which a large output difference appears in a center part and peripheral part (bright in a central part, dark in a peripheral part, and especially dark at four corners) when imaging is performed under uniform driving conditions, as illustrated in FIG. 13A, are corrected. In the array sensor 10 according to the third embodiment, the resistor network RN corresponds to the sensor element array 1 including the sensor elements 6 of 10×10 pixels, which corresponds to an area divided into nine regions: first to nine regions (3×3: division into nine). The first region includes nodes N11, N12, N13, N14, N21, N22, N23, N24, N31, N32, N33, N34, N41, N42, N43, and N44. The second region includes nodes N14 to N17, N24 to N27, N34 to N37, and N44 to N47. The third region includes nodes N17 to N1A, N27 to N2A, N37 to N3A, and N47 to N4A. The ninth region includes nodes N77 to N7A, N87 to N8A, N97 to N9A, and NA7 to NAA. For example, "A" in the node N1A represents "10", and the node N1A represents a node in the first row from the top and the tenth column from left.

Bias voltages BIAS 11, . . . , and BIAS AA are applied to the corners of the first to ninth regions, that is, the nodes N11, N14, N17, N1A, N41, N44, N47, N4A, N71, N74, N77, N7A, NA1, NA4, NA7, and NAA. That is, the resistor network RN in the array sensor according to the third embodiment is divided into nine, and voltages are supplied from sixteen voltage application nodes. For example, as in the second embodiment explained with reference to FIG. 10, connection of the first resistor elements R1 and the second resistor elements R2 is performed such that, for example, nodes corresponding to a frame part in each region are connected with the first resistor elements R1 therebetween, and the other nodes are connected with the second resistor elements R2 therebetween.

For example, a voltage of 2 V is applied as bias voltages BIAS 44, BIAS 47, BIAS 74, and BIAS 77 to the nodes (voltage application nodes) N44, N47, N74, and N77, and a voltage of 1 V is applied as bias voltages BIAS 11, BIAS 1A, BIAS A1, and BIAS AA to the nodes N11, N1A, NA1, and NAA. Furthermore, a voltage of 1.5 V is applied as bias voltages BIAS 14, BIAS 17, BIAS 41, BIAS 4A, BIAS 71, BIAS 7A, BIAS A4, and BIAS A7 to the nodes N14, N17, N41, N4A, N71, N7A, NA4, and NA7.

Accordingly, the array sensor 10 according to the third embodiment is able to obtain, for example, a high-quality captured image, as illustrated in FIG. 13C, without a clear borderline or the like being generated, by performing compensation as illustrated in FIG. 13B for the captured image illustrated in FIG. 13A under uniform driving conditions. Furthermore, for example, by performing known two-point correction on the captured image for which the compensation has been performed as illustrated in FIG. 13C, the output image may be obtained as illustrated in FIG. 13D. It is obvious that various types of known image processing as well as two-point correction may be performed in each of the embodiments described above. Furthermore, the resistor network RN is not necessarily divided into 2×2 or 3×3, and it is obvious that various types of division may be performed. As in the first embodiment explained with reference to FIGS. 8A and 8B and FIGS. 9A, 9B, and 9C, the resistor network RN may be regarded in a linear manner in the row direction or the column direction.

Figure 14:
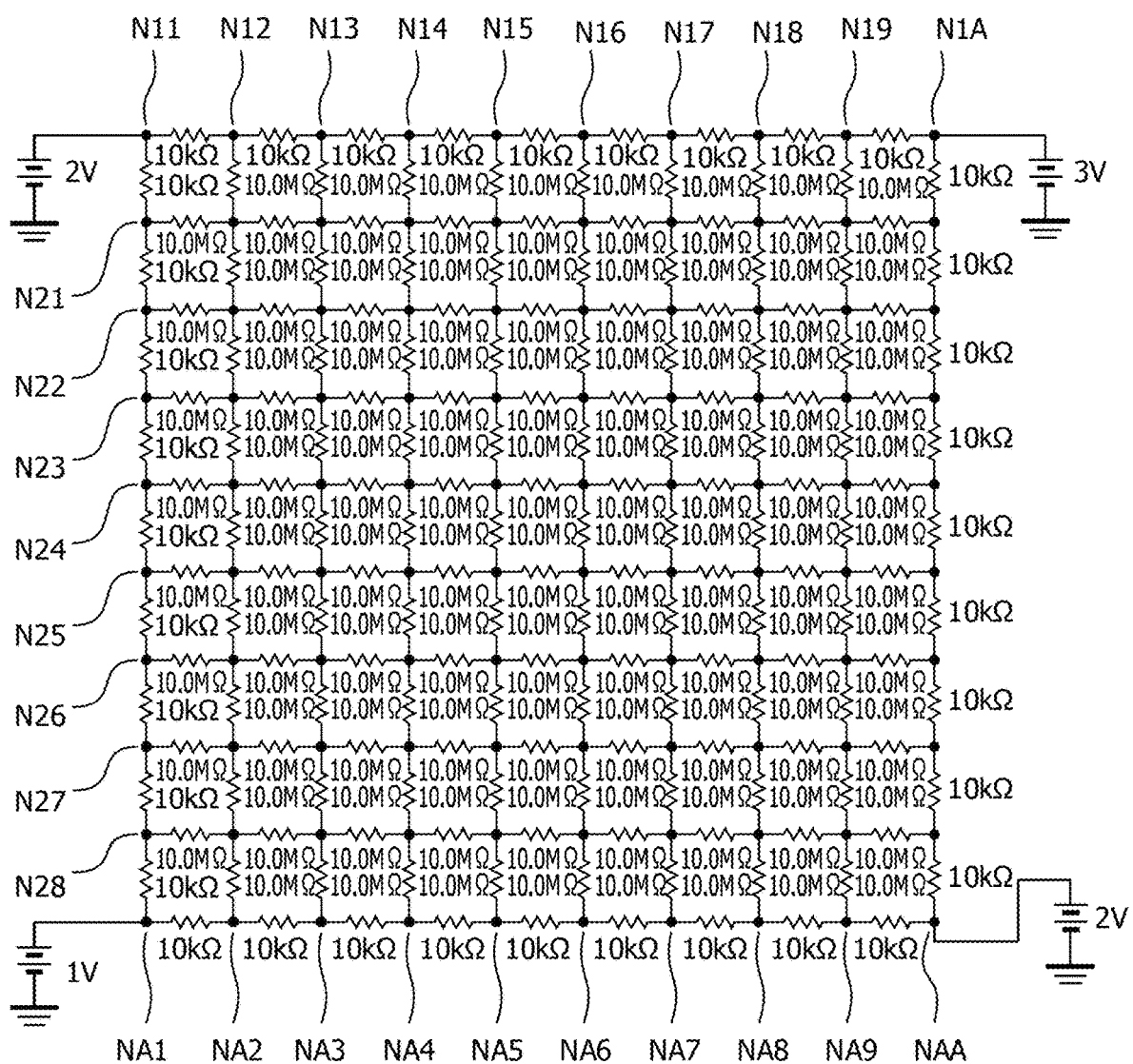
FIG. 14 is a circuit diagram illustrating a specific example of a modification of the array sensor according to the second embodiment illustrated in FIG. 10.

FIG. 14 is a circuit diagram illustrating a specific example of a modification of the array sensor according to the second embodiment illustrated in FIG. 10. In the modification illustrated in FIG. 14, the resistor network RN illustrated in FIG. 10 corresponds to a sensor element array including sensor elements of 10×10 pixels as in FIG. 12 and voltages to be applied are varied. The resistance of the first resistor element R1 is set to 10 kΩ, and the resistance of the second resistor element R2 is set to 10 MΩ.

In the example illustrated in FIG. 14, in the nodes (bias voltage supply nodes) N11 to NAA of 10×10 pixels, the nodes N11, N1A, NA1, and NAA at the four corners are defined as voltage application nodes. A voltage of 2 V is applied to the nodes N11 and NAA, a voltage of 3 V is applied to the node N1A, and a voltage of 1 V is applied to the node NA1. As described above, a voltage to be applied may be set such that, for example, based on a captured image obtained under uniform conditions, the quality of the image is improved by compensating (correcting) the image. The resistances of the first resistor element R1 and the second resistor element R2 are merely examples, and the resistances may be set to various values. Furthermore, as in the third embodiment described above, it is obvious that division into a plurality of regions may be performed.

Figure 15:
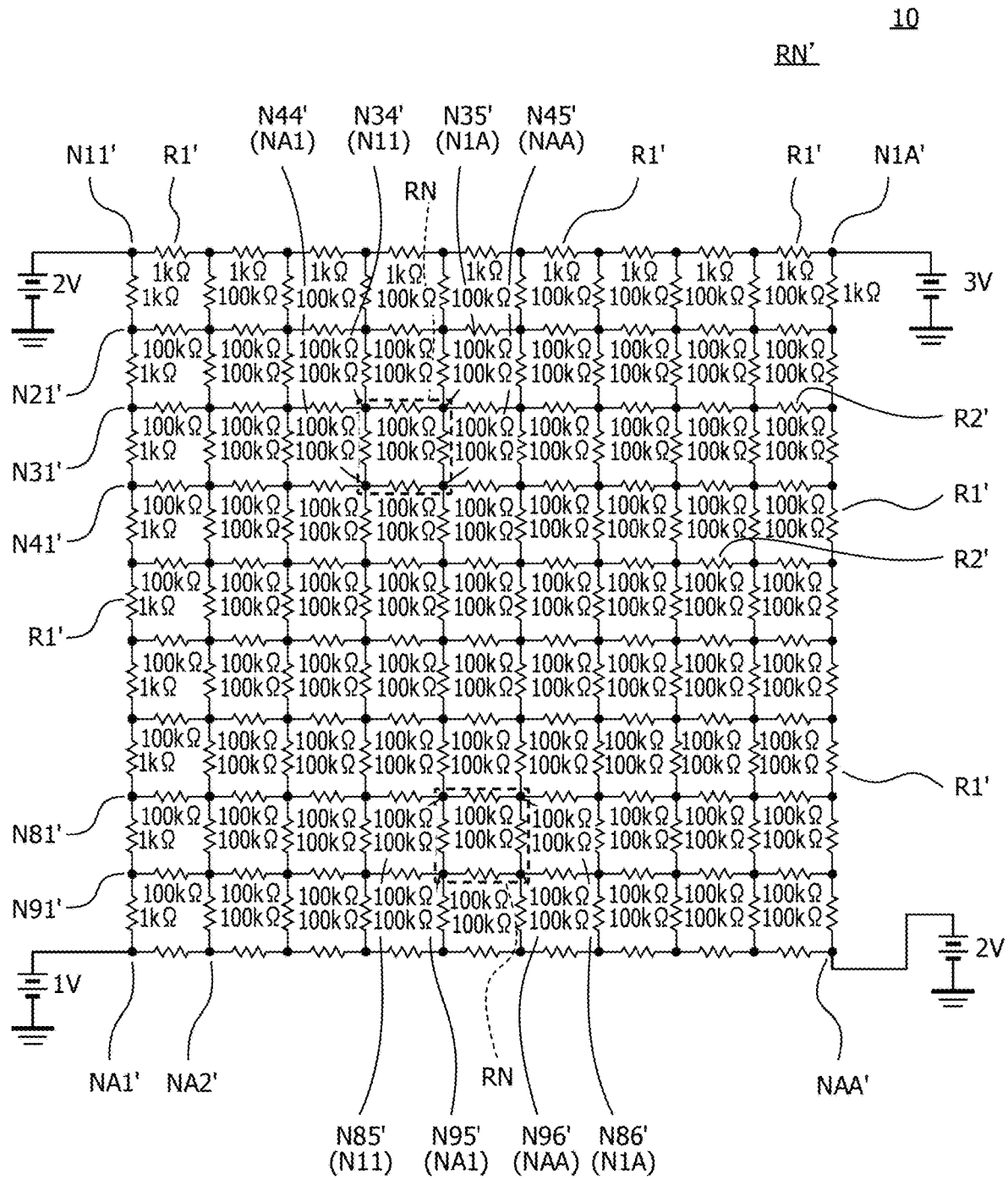
FIG. 15 is a circuit diagram illustrating another specific example of a modification of the array sensor according to the second embodiment illustrated in FIG. 10.

FIG. 15 is a circuit diagram illustrating another specific example of a modification of the array sensor according to the second embodiment illustrated in FIG. 10. In the modification illustrated in FIG. 15, the resistor network in FIG. 10 corresponds to a sensor element array including sensor elements of 100×100 pixels and is hierarchized. That is, a resistor network RN' illustrated in FIG. 15 includes 10×10 resistor networks RN each corresponding to the sensor element array including sensor elements of 10×10 pixels explained with reference to FIG. 14. Each of the 10×10 nodes in the resistor network RN' illustrated in FIG. 15 are connected to the nodes N11, N1A, NA1, and NAA at the corners of the resistor network RN illustrated in FIG. 14, and voltages are applied to the individual nodes.

For example, nodes (bias voltage supply nodes) N34', N35', N44', and N45' in the resistor network RN' illustrated in FIG. 15 are connected to the nodes (voltage application nodes) N11, N1A, NA1, and NAA in the resistor network RN illustrated in FIG. 14 and supply specific voltages. Furthermore, for example, nodes N85', N86', N95', and N96' in the resistor network RN' illustrated in FIG. 15 are connected to the nodes N11, N1A, NA1, and NAA in the resistor network RN illustrated in FIG. 14 and supply specific voltages.

In the resistor network RN' illustrated in FIG. 15, the resistance of the first resistor element R1' is set to 1 kΩ, and the resistance of the second resistor element R2' is set to 100 kΩ. However, the above resistances are merely examples, and the resistances may be set to various values. Furthermore, in the resistor network RN' illustrated in FIG. 15, regarding the nodes at the corners, a voltage of 2 V is applied to the nodes N11' and NAA', a voltage of 3 V is applied to the node N1A', and a voltage of 1 V is applied to the node NA1'. However, as described above, it is obvious that, for example, various voltages may be applied, based on a captured image obtained under uniform driving conditions.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An array sensor comprising:
   a sensor element array that includes a plurality of sensor elements;
   a signal processing circuit array that includes a plurality of signal processing circuits coupled to the corresponding sensor elements; and
   a resistor network that supplies bias voltages to the corresponding signal processing circuits,
   the resistor network includes bias voltage supply nodes which are arranged in a grid shape via one or more resistor elements,
   the bias voltage supply nodes each supplies respective bias voltages to the respective signal processing circuits and are classified into first bias voltage supply nodes which receive respective other bias voltages which are different from the bias voltages and second bias voltage supply nodes which do not receive the other bias voltages, and the other bias voltages are different from each other between at least two nodes of the first bias voltage supply nodes.

2. The array sensor according to claim 1, wherein the plurality of signal processing circuits are arranged in a grid shape.

3. The array sensor according to claim 2, wherein the first bias voltage supply nodes are defined only in one of a row direction and a column direction of the bias voltage supply nodes, and wherein voltages at the second bias voltage supply nodes in an other one of the row direction and the column direction are set to a same potential.

4. The array sensor according to claim 2, wherein the one or more resistor elements includes one of a first resistor element having a first resistance and a second resistor element having a second resistance that is larger than the first resistance, and wherein at least one of the first resistor element and the second resistor element is coupled to the first bias voltage supply nodes, and none of the first resistor elements is coupled to the second bias voltage supply nodes.

5. The array sensor according to claim 4, wherein the first bias voltage supply nodes are defined for each block including a part of the bias voltage supply nodes.

6. The array sensor according to claim 5, wherein at least two of the first resistor elements are provided between the first bias voltage supply nodes, and wherein at least one of the second resistor elements is provided between the second bias voltage supply nodes.

7. The array sensor according to claim 4, wherein the resistor network has a frame shape in outermost row and column directions to which a plurality of first resistor elements are coupled, and wherein four corners of the frame shape are defined as the first bias voltage supply nodes.

8. The array sensor according to claim 7, wherein the resistor network is divided in a row direction and a column direction in which the resistor network is divided for a specific number of bias voltage supply nodes.

9. The array sensor according to claim 1, wherein the sensor elements are infrared sensor elements.

10. An imaging apparatus comprising:
an optical system that captures an image of an object;
an array sensor that includes a sensor element array that includes a plurality of sensor elements, a signal processing circuit array that includes a plurality of signal processing circuits coupled to the corresponding sensor elements, and a resistor network that supplies respective bias voltages to the corresponding signal processing circuits; and
a control system that controls the array sensor and generates an output image by receiving and processing output of the array sensor, the resistor network includes bias voltage supply nodes which are arranged in a grid shape via one or more resistor elements,
the bias voltage supply nodes each supplies the respective bias voltages to the respective signal processing circuits and are classified into first bias voltage supply nodes which receive respective other bias voltages which are different from the bias voltages and second bias voltage nodes which second which do not receive the other bias voltages, and
the other bias voltages are different from each other between at least two nodes of the first bias voltage supply nodes.

\* \* \* \* \*